(12) United States Patent
Mickmann et al.

(10) Patent No.: US 9,761,965 B2
(45) Date of Patent: Sep. 12, 2017

(54) ELECTRONIC DEVICE

(71) Applicant: WAGO Verwaltungsgesellschaft mbH, Minden (DE)

(72) Inventors: Viktor Mickmann, Bielefeld (DE); Axel Buchmeier, Heeβen (DE)

(73) Assignee: WAGO VERWALTUNGSGESELLSCHAFT MBH, Minden (DE)

( * ) Notice: Subject to any disclaimer, the term of this patent is extended or adjusted under 35 U.S.C. 154(b) by 0 days.

(21) Appl. No.: 15/031,233

(22) PCT Filed: Oct. 20, 2014

(86) PCT No.: PCT/EP2014/072441
§ 371 (c)(1),
(2) Date: Apr. 21, 2016

(87) PCT Pub. No.: WO2015/059093
PCT Pub. Date: Apr. 30, 2015

(65) Prior Publication Data
US 2016/0248180 A1    Aug. 25, 2016

(30) Foreign Application Priority Data
Oct. 21, 2013    (DE) .......................... 10 2013 111 580

(51) Int. Cl.
*H01R 13/627*    (2006.01)
*H01R 9/24*    (2006.01)
(Continued)

(52) U.S. Cl.
CPC ......... *H01R 9/2458* (2013.01); *H01R 9/2675* (2013.01); *H05K 7/1468* (2013.01); *H01R 9/2625* (2013.01)

(58) Field of Classification Search
CPC .................. H01R 13/6275; H01R 13/6582
(Continued)

(56) References Cited

U.S. PATENT DOCUMENTS

| 8,986,033 B2 * | 3/2015 | Berger ................. H05K 7/1468 439/341 |
| 2003/0143896 A1 | 7/2003 | Bet et al. |
| 2014/0156029 A1 | 6/2014 | Godau et al. |

FOREIGN PATENT DOCUMENTS

| DE | 299 06 583 U1 | 7/1999 |
| DE | 20 2010 004 408 U1 | 4/2011 |

(Continued)

OTHER PUBLICATIONS

International Search Report for corresponding patent application No. PCT/EP2014/072441 dated Feb. 12, 2015.
(Continued)

*Primary Examiner* — Phuong Dinh
(74) *Attorney, Agent, or Firm* — Renner, Otto, Boisselle & Sklar, LLP

(57) ABSTRACT

An electronic device (1) is described comprising a base module (2) and an electronic module (3) detachably pluggable onto the base module (2). The base module (2) comprises an insulation material housing (16) with a snap-in base (5) for attaching the base module (2) on a carrier rail and plug contacts (7, 8) on the side walls. The electronic module (3) comprises an insulation material housing (20) and is connectable to the plug contacts (7, 8) of the base module (2) in the attached state on the base module (2). The base module (2) and the electronic module (3) comprise interacting snap-in elements (23, 26) for locking the base module (2) and the electronic module (3) to each other when the electronic module (3) is attached to the base module (2) A snap-in element (23) of the electronic module (3) comprises a protruding activation lug (27) on a second face (15)

(Continued)

of the electronic device (1). The electronic module (3) comprises a protruding catch lug (19) on its first face (11) opposite the second face (15). The electronic module (3) and the base module (2) comprise interacting linear guides (35*a*, 35*b*; 36*a*, 36*b*), wherein the electronic module (3) is held linearly displaceable on the base module (2) using the linear guides (35*a*, 35*b*; 36*a*, 36*b*) and is receivable on the base module (2).

12 Claims, 6 Drawing Sheets

(51) Int. Cl.
*H05K 7/14* (2006.01)
*H01R 9/26* (2006.01)

(58) Field of Classification Search
USPC .......................................... 439/353, 715, 716
See application file for complete search history.

(56) References Cited

FOREIGN PATENT DOCUMENTS

DE  10 2011 110 182 A1  2/2013
WO  2011/120881 A1  10/2011

OTHER PUBLICATIONS

International Preliminary Report on Patentability for corresponding patent application No. PCT/EP2014/072441 dated Apr. 26, 2016.

* cited by examiner

1

ELECTRONIC DEVICE

RELATED APPLICATIONS

This application is a national phase of International Application No. PCT/EP2014/072441 filed Oct. 20, 2014.

TECHNICAL FIELD

The invention relates to an electronic device having a base module and an electronic module that can be plugged onto the base module in a detachable manner, wherein the base module comprises an insulating-material housing having a latching base for latching the base module to a carrier rail and plug contacts on the side walls, and wherein the electronic module comprises an insulating-material housing and when plugged onto the base module can be connected to allocated plug contacts of the base module, and wherein the base module and the electronic module have interacting latching elements for latching the base module and the electronic module to one another when the electronic module is plugged onto the base module.

BACKGROUND

Electronic devices of this type are used in particular for decentralized modular control systems. A number of such electronic devices are attached one next to the other to a carrier rail. A head module at the beginning of such a row of electronic devices is embodied as a field bus coupler or as a field bus controller. A control program can run in a field bus controller, control the field bus components that can be connected to the single electronic device, or collect data from the field bus component and evaluate said data using the control program and use said data to further control the field bus devices. Such field bus devices can be actuators, sensors or other devices.

With the aid of the plug contacts on the side walls, a data bus is established that can be used to exchange data between the head module and the electronic devices and where necessary between the electronic devices themselves. This data can be control data, measurement data or another other data. With the aid of the plug contacts on the side walls of the electronic devices, a continuous voltage supply is furthermore provided for the electronic devices so as to supply the electronic components of the electronic device with electrical power. Furthermore, plug contacts can be provided on the side walls and preferably spaced apart with respect to the plug contacts for the data bus and the system voltage supply so as to provide a power supply with which the field bus components that are connected to the electronic devices are supplied with electrical power. These plug contacts are mostly designed for a considerably greater current flow than the plug contacts for the system voltage supply and for the data bus.

A module control device is known for example from DE 10 2011 110 182 A1, wherein the electronic devices are embodied in three parts with a base module, an electronic module that can be attached to said base module, and a conductor connecting module that can be attached to the electronic module. The conductor connecting module has conductor connecting contacts for connecting electrical conductors. When the conductor connecting module is in the state in which it is plugged onto the electronic module, the individual conductor connecting contacts can be connected to the electronic module in an electrically conductive manner. By virtue of plugging the electronic module onto the base module, the electronic module is connected in an electrically conductive manner to the plug contacts on the side walls of the base module. The base module has a latching base for attaching the base module to a carrier rail. The conductor connecting module can be detached from the electronic module, so that in order to replace the electronic module, for example in the case of a defective electronic system, it is not necessary to unclamp the electrical lines individually from the electronic device. The conductor connecting module is connected at an end face wall in an articulated manner to the electronic module. The electronic module for its part can be connected on the opposite side in an articulated manner to the base module. The conductor connecting module is received in a pivotable manner in a bearing that is provided on an elastically resilient latching arm of the electronic module. The latching arm has an actuating lug that protrudes into a latching opening of the base module. As a result, the electronic module can be pivoted downwards from the base module together with the conductor connecting module by virtue of actuating the latching arm.

In the case of this known electronic device, it is possible in a very simple manner even during operation to pull the electronic module together with the conductor connecting module away from the base module. This can lead to considerable problems in the controlled system if the electronic module etc. is for example unintentionally pulled off during the running operation.

SUMMARY

It follows from this that the object of the present invention is to provide an improved electronic device, wherein it is possible to replace the electronic module in as simple a manner as possible without using a tool and yet in a safe manner.

The object is achieved by virtue of the electronic device having the features of claim 1. Advantageous embodiments are described in the subordinate claims.

It is proposed for an electronic device of the generic type that a latching element of the electronic module has an actuating lug on a second end face of the electronic device and said latching element has a catch lug on its first end face of the electronic device that is lying opposite the second end face, and that the electronic module and the base module have linear guides that interact with one another, wherein the electronic module is held on the base module by the linear guides in a linear displaceable manner and can be received on the base module.

By virtue of the pair of actuating lug and catch lug that are arranged on the end faces that lie opposite one another, it is possible in connection with the linear guide on the electronic module and the base module to grip the electronic module on the actuating lug and catch lug with the hand and to pull them upwards from the base module in an almost perpendicular direction. By virtue of gripping the electronic module with the hand in such a manner that the fingers of one hand lie on one side on the actuating lug and on the other side lie on the catch lug, the latching element that interacts with the actuating lug is actuated simultaneously and the electronic module is unlatched from the base module. It is possible in this manner for the electronic module, which is otherwise secured to the at least one latching element on the base module, to be detached from the base module in a simple manner, wherein the electronic module is still reliably latched to the base module during the operating state. However, it is only possible to unplug the electronic module from the base module if the electronic module is gripped on both sides. In lieu of a pivot movement that requires a force to act only on one side, the electronic module is simultaneously secured to the base module by means of the linear guide and the associated necessity of the force acting simultaneously on both end face ends that lie adjacent to one another.

The term 'lug' is understood to mean a part that protrudes opposite the directly adjacent region. It is not essential that the lug protrudes out of the plane that extends through the end face, in other words protrudes out of the end face wall, or already terminates in front of or on the plane of the end face wall.

It is particularly advantageous if the latching element comprising the actuating lug is embodied as an elastically resilient latching arm that is arranged on an end face wall of the electronic module and has a latching lug on its free end. This latching lug of the elastically resilient latching arm is then embodied in such a manner that, when the electronic module is plugged onto the base module, the latching lug protrudes into a latching opening that is embodied on the end face wall of the base module so as to lock the electronic module on the base module. When pushing the protruding actuating lug in the direction towards the electronic module, the latching lug is guided out of the latching opening and the electronic module is unlatched from the base module. Said electronic module can then be pulled away upwards in a perpendicular manner with respect to the plane that extends through the lower face of the base module and through the one carrier rail to which the base module is attached.

It is particularly advantageous if an elastically resilient latching arm is formed as one in an integral manner with the insulating-material housing of the electronic module. The latching arm has the actuating lug and also at its free end a latching lug and, in the plugged-on state latched onto the base module, faces with its free end the base module. This has the advantage that the resilient latching arm is pivoted initially once into an open position as the electronic module is plugged onto the base module by means of an inclined connecting module face of the latching lug and upon arriving at the latching opening in the plugged-on state automatically springs back as a result of the resilient elasticity of the latching arm, so that the latching lug protrudes into the latching opening and a connecting piece that delimits the latching opening at the free end of the latching arm forms a stop for the latching lug.

For this purpose, a latching protrusion that protrudes in the direction towards the electronic module and comprises the latching opening that is delimited by means of a connecting piece at the free end of the latching protrusion is provided on the insulating-material housing of the base module.

It is particularly advantageous if at one end face of the electronic device latching elements are provided having the elastically resilient latching arm and the allocated latching opening, and at the opposite lying end face the electronic module is not directly latched onto the base module. The electronic module is consequently only latched to the base module at one side having an elastically resilient latching arm. In contrast, the opposite side does not have any latching means between the electronic module and the base module.

In this connection, it is particularly advantageous if the electronic device has a conductor connecting module that can be plugged onto the electronic module and comprises conductor connecting terminals for connecting electrical lines. In the operating state in which the conductor connecting module is plugged onto the electronic module, these conductor connecting terminals are connected in an electrically conductive manner to the electronic module. As a consequence, field bus components can be connected to the electronic device by way of electrical lines. In the case of this preferred exemplary embodiment, the conductor connecting module and the base module have on the first end face, which lies opposite the elastically resilient latching arm and the allocated latching opening, elements for fixing the conductor connecting module onto the base module. Consequently, on the one side the electronic module having the elastically resilient latching arm is latched onto the base module and on the opposite side the conductor connecting module is fixed to the base module. By virtue of the fact that the conductor connecting module protrudes over the electronic module and is locked directly to the electronic module, the electronic module is fixed to the base module in this manner indirectly by way of locking the conductor connecting module and secured to prevent it being pulled out. This has the advantage that it is not possible to unintentionally dismantle the electronic device for example by pulling excessively on the electrical conductors. The electronic module can only be removed from the base module if the conductor connecting module has been previously removed from the electronic module lying thereunder by virtue of disconnecting the fixing arrangement between the conductor connecting module and the base module. As a consequence, it is possible in a separate second step for the electronic module to be pulled away from the base module by virtue of exerting pressure on the protruding actuating lug and opposite lying catch lug.

In a further preferred embodiment, the protruding catch lug of the electronic module protrudes into an opening in the insulating material housing of the base module. It is particularly advantageous if the protruding catch lug also protrudes through the opening in the insulating-material housing of the base module and protrudes out of the end face wall of the base module in order to be gripped in a reliable and simple manner by a finger over the outer face of the associated end face wall so as to pull out the electronic module.

The catch lug is preferably arranged adjacent to a conductor connecting module that in the operating state is plugged onto the electronic module, in other words at a site that is remote from the base of the base module having the latching base.

The resilient latching arm of the actuating lug is preferably arranged closer to the plane that extends through the lower face of the base module having the latching base than the catch lug that lies opposite the actuating lug. This has the advantage that the electronic module having the resilient latching arm is locked onto the base module closer to the carrier rail and the catch lug lies on the opposite side in such a manner that a hand can still reach said catch lug if on the opposite side the actuating lug of the resilient arm is pushed downwards by a different finger of the same hand and is held so as to be pulled out.

Furthermore, it is advantageous if the actuating lug has flutings on the elastically resilient latching arm and/or on the catch lug. These flutings can be formed by way of example by means of connecting pieces that extend in a transverse manner with respect to the plugging-in direction and are spaced apart from one another.

Furthermore, it is advantageous if the linear guides extend in a diagonal manner at least on one end face so as to guide the electronic module into an end position. An opposite lying linear guide that does not necessarily have to be arranged on an end face wall can be arranged extending either in a perpendicular manner with respect to the plane of the base module and a carrier rail to which the base module is attached, or can extend in a slightly diagonal manner at least in an entry region.

BRIEF DESCRIPTION OF THE DRAWINGS

The invention is further explained hereinunder with reference to an exemplary embodiment and the attached drawings, in which.

DETAILED DESCRIPTION

Figure 1:
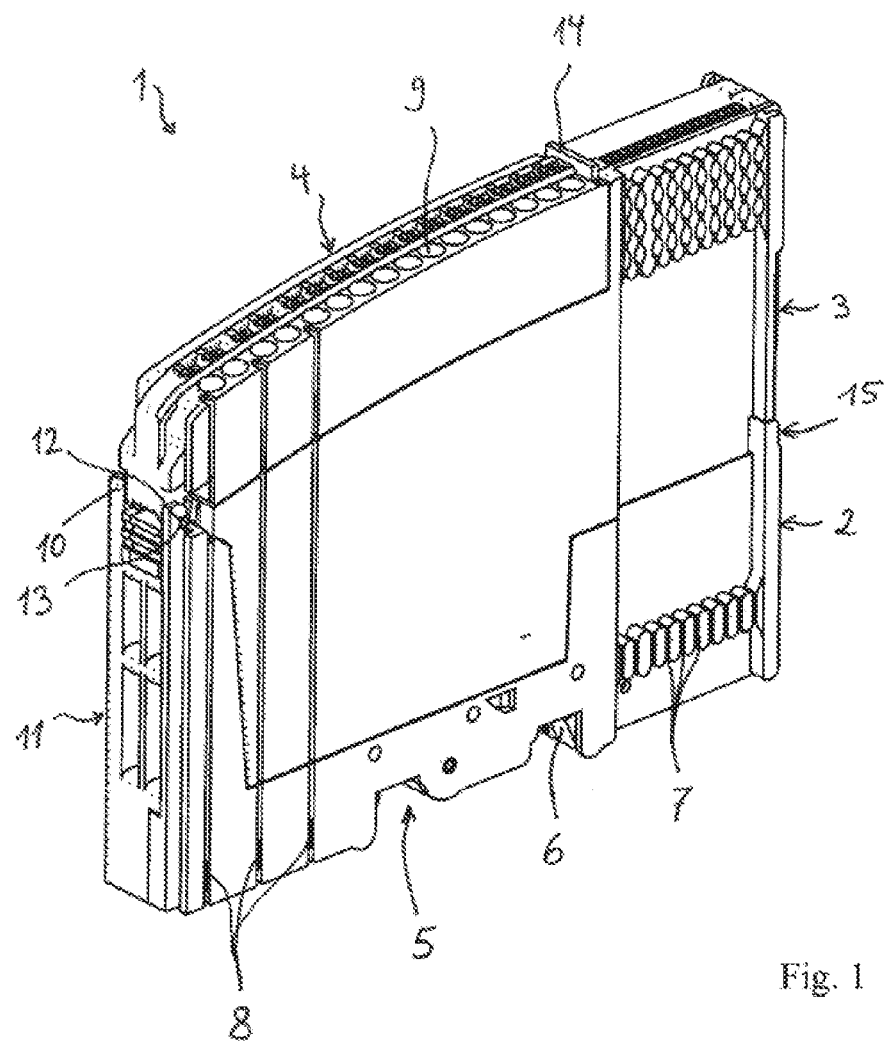
FIG. 1—illustrates a perspective view of a three-part electronic device.

FIG. 1 illustrates a perspective view of an electronic device 1 that is constructed in three parts and has a base module 2, an electronic module 3 that can be plugged onto the base module 2, and a conductor connecting module 4 that can be plugged onto the electronic module 3. The base module 2 has on its lower face a latching base 5 that is provided with movable carrier rail latching lugs 6 in order to attach the base module 2 to a carrier rail (not illustrated) and to fixedly clamp said base module on said carrier rail.

Plug contacts 7 are provided on the side walls of the base module 2 that lie opposite one another. These plug contacts 7 are embodied so as to come into contact with adjacent plug contacts of an adjacent electronic device 1 if the electronic devices 1 are latched adjacent to one another in a row on a carrier rail. It is possible in this manner with the aid of the plug contacts 7 to establish a data bus that is continuous by virtue of the row of electronic devices 1. In addition, it is possible using the plug contacts 7 to supply the electronic module 3 with electrical energy by way of the voltage supply lines.

Spaced apart from this group of plug contacts 7, a further group of plug contacts 8 is provided beneath the conductor connecting module 4. These plug contacts 8 are embodied so as by virtue of a higher current carrying capacity to provide a power energy supply for a field bus component that is connected to the electronic device 1. These field bus components can be connected by way of electrical lines to the electronic device 1 if the electrical lines are contacted by means of the conductor entry openings 9 in the conductor connector module 4 by allocated conductor connecting terminals (not visible) that are provided in the conductor connecting module 4. The conductor connecting module 4 is articulated in a pivotable manner to a pivot bearing 10 on the first end face 11 of the base module 2. For this purpose, protruding mounting spigots 12 protrude at the free end of the conductor connecting module 4 into latching grooves 13 of the pivot bearing. A latching protrusion 14 is provided on the side lying opposite the pivot bearing 10 and the conductor connecting module 4 can be tilted by means of said latching protrusions upwards from the electronic module 3 and about the pivot bearing 10. Subsequently, the pivot bearing arrangement can be disconnected and the conductor connecting module 4 can be completely removed.

A latching arrangement is provided in the region of the latching protrusion 14 so as to latch or to lock the conductor connecting module 4 in the illustrated operating condition fixedly to the electronic module 3.

In the illustrated operating state, the conductor connecting contacts that are received in the conductor connecting module 4 come into contact with the electronic system on the electronic module 3 and/or are electrically connected to the plug contacts 7, so that connected field bus components can be controlled by means of the electronic module 3 in a predetermined specified manner or signals can be received by a field bus component and can be onwards transmitted by way of a data bus.

It is necessary for example in the case of a malfunction to replace the electronic module 3 as quickly as possible and without the use of a tool. However, this may only occur if the proper operation of the controlled system is not endangered. In addition, it is necessary to prevent that the electronic module 3 is removed from the base module 2 for example by means of pulling on the electrical conductor that is connected to the conductor connector module 4.

For this purpose, the electronic module 3 is secured in the region of the first end face 11 to the base module 2 by virtue of the fact that it is automatically held in the operating position indirectly by way of the conductor connecting module 4 that is received in the pivot bearing 10. The electronic module 3 is thus indirectly fixed on the first end face 11 to the base module 2.

In contrast, on the second end face 15 of the electronic device 1 that lies opposite the first end face 11, the electronic module 3 is latched directly to the base module 2 in the illustrated operating position if the electronic module 3 is plugged onto the base module 2.

Figure 2:
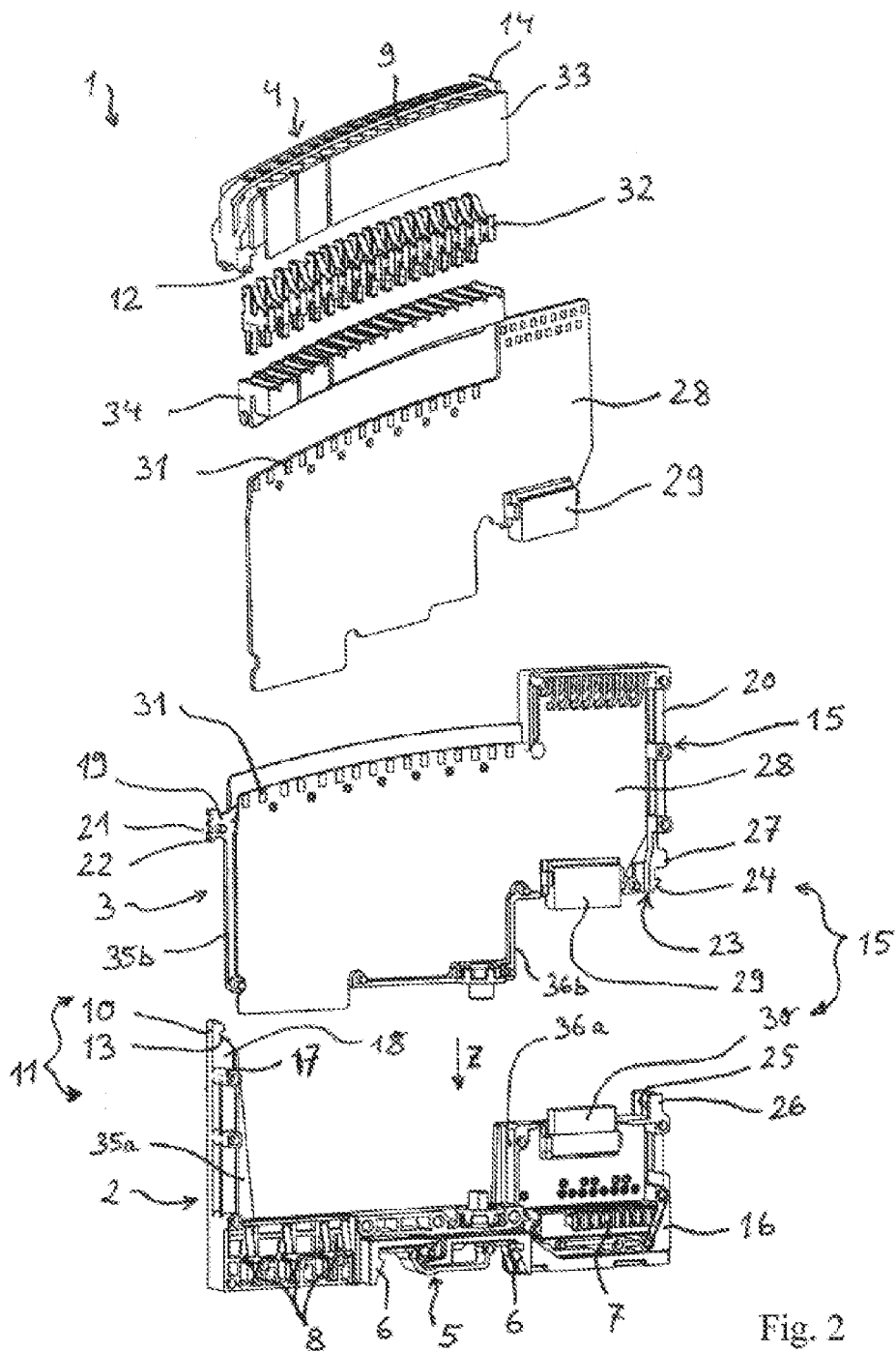
FIG. 2—illustrates an exploded view of the three-part electronic device in FIG. 1 with a double sided illustrated circuit board and also without the cover of the electronic module and base module.

FIG. 2 illustrates a perspective exploded view of the electronic device 1 in FIG. 1 in the part opened state. It is clear that the base module 2 has an insulating-material housing 16 that is embodied from a synthetic material. A pivot bearing 10 is provided on the first end face 11 lying opposite the base section having the plug contacts 7, 8 and said pivot bearing is formed by means of bearing recesses 13. By virtue of transverse extending connection sleeves 17, an opening 18 that lies above said connection sleeves is formed in the insulating-material housing 16 into which a protruding catch lug 19 can protrude at the insulating-material housing 20 of the electronic module 3. The catch lug 19 protrudes into the opening 18 and protrudes at the outer face out of the plane preferably out of the plane that is defined by means of the end face wall at the first end face 11.

It is clear that flutings 21 are formed on the protruding catch lug 19 in the form of connecting pieces 22 that extend in a transverse manner with respect to the plug-in direction Z, said connecting pieces being arranged spaced apart from one another.

It is possible with the aid of these flutings 21 to exert a pressure on the catch lug 19 when gripping the electronic module 3 and to pull the electronic module 3 upwards using the finger without slipping off the catch lug 19. An elastically resilient latching arm 23 is arranged on the opposite lying second end face 15 at the insulating-material housing 20 of the electronic module 3 and said latching arm extends in the plug-in direction Z downwards in the direction towards the base module 2. A latching lug 24 that has a triangular, tapering cross section is arranged on the free end of the latching arm 23 and said latching lug in the operating state, when the electronic module 3 is plugged onto the base module 2, protrudes into a latching opening 25 at a latching protrusion that is formed on the insulating-material housing 16 of the base module 2. As a consequence, the electronic module 3 is latched in the operating state by means of the latching lug 24 in the latching opening 25 and is fixed to the base module 2.

Furthermore, a protruding actuating lug 27 is arranged on the elastically resilient latching arm 23 that extends outwards from the electronic module 3 towards the end face wall 15. When gripping the electronic module 3 with the hand, it is possible, by virtue of exerting pressure on the actuating lug 27 in the direction towards the inner space of the electronic module 3 using the finger of the hand of a user, to displace the latching protrusion 23 in the direction towards the center of the electronic module 3. This causes the latching lug 24 to move out of engagement with the latching opening 25 of the latching protrusion 26 of the base module 2 so that the electronic module 3 can be pulled away upwards in the opposite direction to the plugging-in direction Z in a perpendicular manner with respect to the carrier rail plane, in other words accordingly with respect to the plane of the lower face of the base module 2.

It is further evident that the electronic module 3 has a circuit board 28 in the inner space of its insulating-material housing 20, said circuit board supporting the electronic components. Furthermore, the circuit board 28 has a plug connector 29 that faces in the plug-in direction Z towards the base module 2. The base module 2 has a corresponding plug connector 30. When plugging the electronic module 3 onto the base module 2, the plug connectors 29, 30 come into engagement with one another so that an electrically conductive contact is produced between the electronic components on the circuit board 28 and the allocated plug connectors 7.

On the opposite lying face, the circuit board 28 protrudes downwards so that the contact areas on the circuit board 28 come into direct conductive contact with the plug connectors 8 for the power energy supply.

Contact areas 31 are provided on the upper edge of the circuit board 28 and said contact areas are provided so as to come into contact with conductor connecting terminals 32 in the conductor connecting module 4. In this manner, an electrical conductor that is connected to a conductor connecting terminal 32 can be connected in an electrically conductive manner to the electronic system on the circuit board 28.

It is clear that the conductor connecting module 4 is formed from an insulating-material housing, which is constructed in two parts by means of an upper part 33 and a lower part 34, and from the multiple conductor connecting contacts 32 that are received in said insulating-material housing.

So as to guide the electronic module 3 onto the base module 2 in a perpendicular manner with respect to the plane that extends from the lower face of the base module 2 and a carrier rail that is placed therein in the insertion direction Z, linear guides 35*a*, 35*b*; 36*a*, 36*b* that correspond with one another are provided in the insulating-material housing 16 of the base module 2 and in the insulating material housing 20 of the electronic module 3. Said linear guides extend vertically upwards, in other words perpendicular to the plane that extends from the lower face of the base module 2. This ensures that the electronic module 3 as it is pulled out is pulled off in the upwards direction and without tilting by means of gripping the actuating lug 27 and the catch lug 19 and as said electronic module 3 is plugged in it is attached to the base module 2 in a vertical downwards direction.

Figure 3:
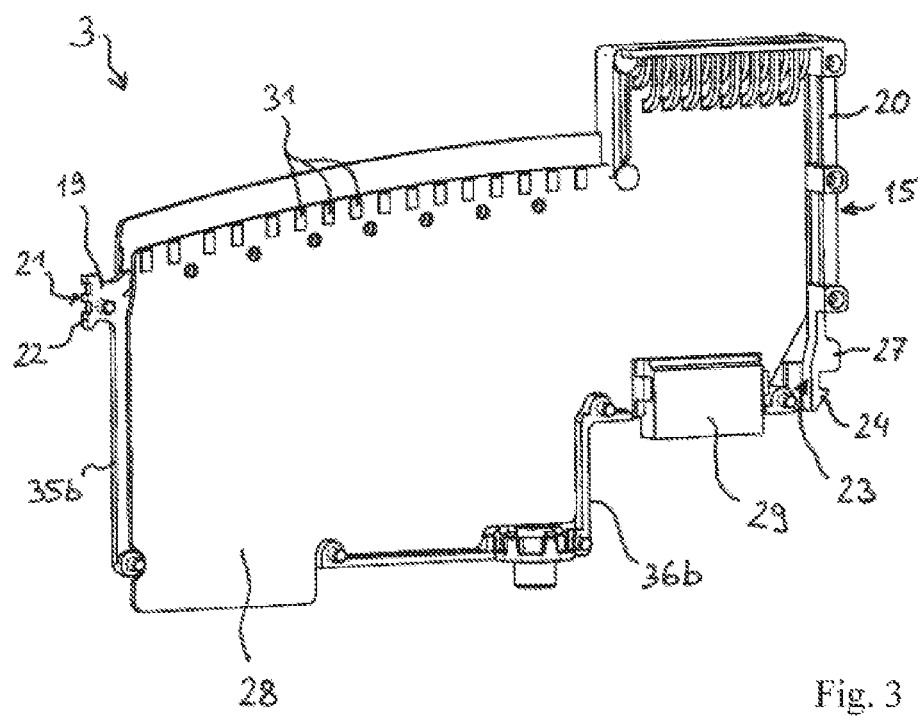
FIG. 3—illustrates a perspective side view of an electronic module without a cover for the electronic device in FIGS. 1 and 2.

FIG. 3 illustrates a side view of the open electronic module 3 in FIG. 2. It is clear that the catch lug 19 protrudes relative to the linear guide 35*b* out of the end face of the electronic module 3.

The contact areas 31 on the circuit board 28 can be either separate contact areas 31, separate contact elements (e.g. solder pins) or end sections of a conductor track on the circuit board 28.

It is also clear that the electronic module 3 is vertically offset and extends deeper into the region below the contact areas 31 than in the region of the plug connector 29. This section that extends deeper is delimited at the end face side by the linear guide 35*b* and 36*b* and protrudes into a corresponding receiving opening having corresponding linear guides 35*a* and 36*a* in the base module 2.

Figure 4:
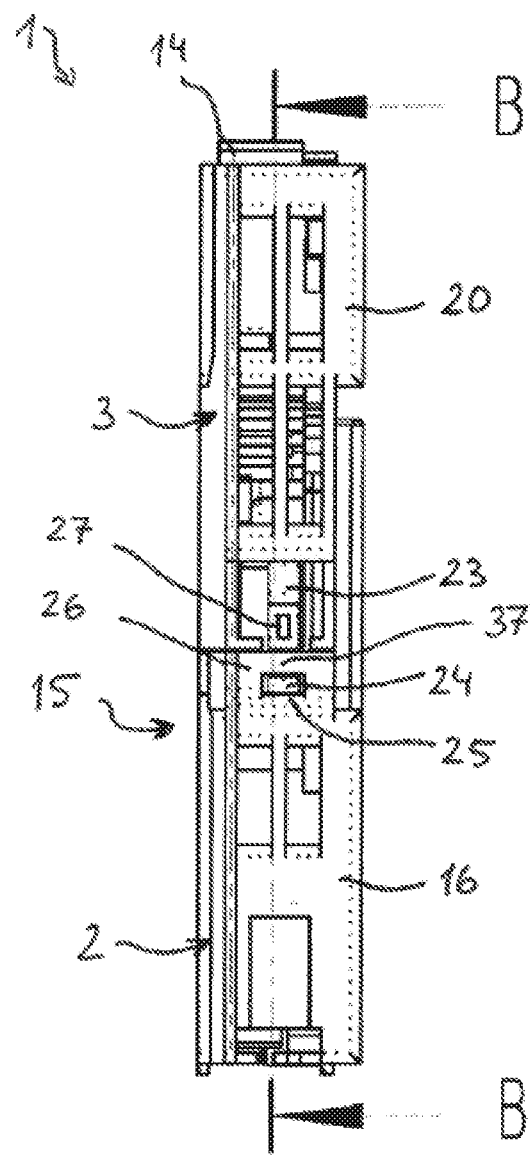
FIG. 4—illustrates a front face view of the end face wall of the electronic device in FIG. 1 with the elastically resilient latching arm on the electronic module and the associated latching protrusion having the latching opening on the base module.

FIG. 4 illustrates a front face view of the second end face 15 of the electronic module 3. It is clear that in the illustrated operating state the electronic module 3 is plugged onto the base module 2 lying thereunder and is latched to said base module. For this purpose, the latching lug 24 of the elastically resilient latching arm 23 protrudes into the latching opening 25 of the latching protrusion 26. This latching protrusion 26 is formed as one in an integral manner from the synthetic material of the insulating-material housing 16 of the base module 2. The latching opening 14 is delimited by a connecting piece 37 at the free end of the latching protrusion 26. This connecting piece 37 forms a stop for the latching lug 24 of the elastically resilient latching arm 23. This elastically resilient latching arm 23 is for its part formed as one in an integral manner from the synthetic material of the insulating-material housing 20 of the electronic module 3.

Furthermore, it is clear that the actuating lug 27 of the latching arm 23 protrudes above the connecting piece 37 of the latching protrusion 26 in the illustrated operating state. Said actuating lug protrudes as far out of the plane of the end face wall at the second end face 15 or is accessible in the second end face 15 by way of an opening that, when gripping the electronic module 3 with the hand, pressure can be exerted by means of a finger of the hand of a user on the protruding actuating lug 27. The latching arm is then pivoted in the direction towards the center of the electronic module 3 by means of the pressure and the locking arrangement is disconnected and the electronic module 3 can be pulled off in the upwards direction. This is facilitated by means of the actuating lug 27 and the opposite lying catch lug 19 with which the electronic module 3 can be gripped with two fingers of a hand and pulled off. Furthermore, FIG. 4 illustrates the section plane B-B through the electronic device 1.

Figure 5:
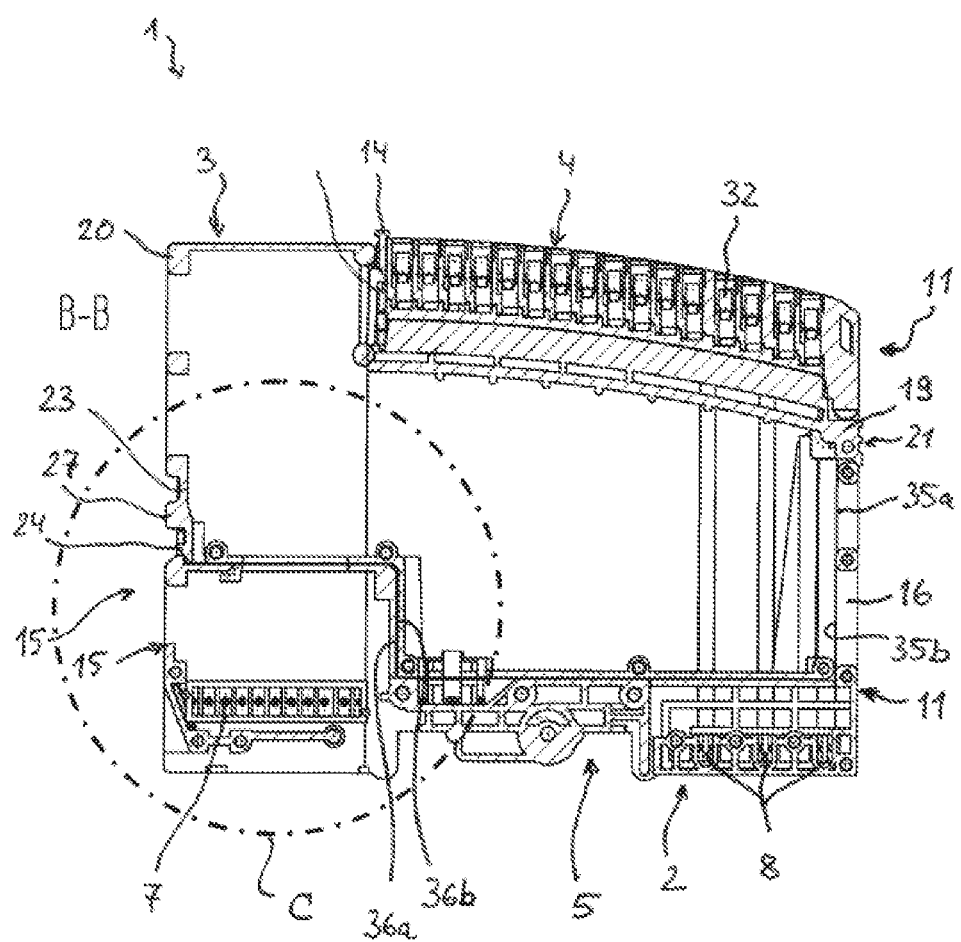
FIG. 5—illustrates a side sectional view along the section line B-B of the electronic device in FIGS. 1 and 4.

FIG. 5 illustrates a side section view along the section line B-B in accordance with FIG. 4 through the electronic device 1. It is clear that the actuating lug 24 and the catch lug 19 lie opposite one another. It is clear that the actuating lug 27 is arranged considerably closer to the lower face of the base module 2 than the catch lug 19. The catch lug 19 is thus located closer to the upper face of the electronic device 1 than the actuating lug 27. This has the advantage that the peripheral spacing between the actuating lug 27 and the catch lug 19 is reduced to the extent that it is possible for example to exert a pressure on the actuating lug 27 using the thumb and to exert pressure on the catch lug 19 using the middle finger in the case of a normal hand size of a user and the electronic device 1 can be gripped comfortably by a hand. In addition, the length of the latching arm 23 can as a consequence be kept relatively short, wherein installation space is reduced and the latching and deflecting characteristics of the elastically resilient latching arm 23 are improved. Despite the actuating lug 27 and the catch lug 19 being vertically offset, the linear guides 35a, 35b; 36a, 36b prevent the electronic module 3 from being pulled out in a tilted manner from the base module 2 or prevent said electronic module 3 from being plugged into the base module 2 in a tilted manner.

It is also clear that at least the protruding catch lug 19 protrudes slightly with its flutings 21 out of the connecting module surface of the first end face 11.

In contrast, the opposite lying actuating lug 27 terminates in the plane of the second end face 15. Nevertheless, it can be easily actuated and held using the finger since a sufficiently large opening is provided in the insulating-material housing 20 of the electronic module 3 around the protruding actuating lug 27.

Figure 6:
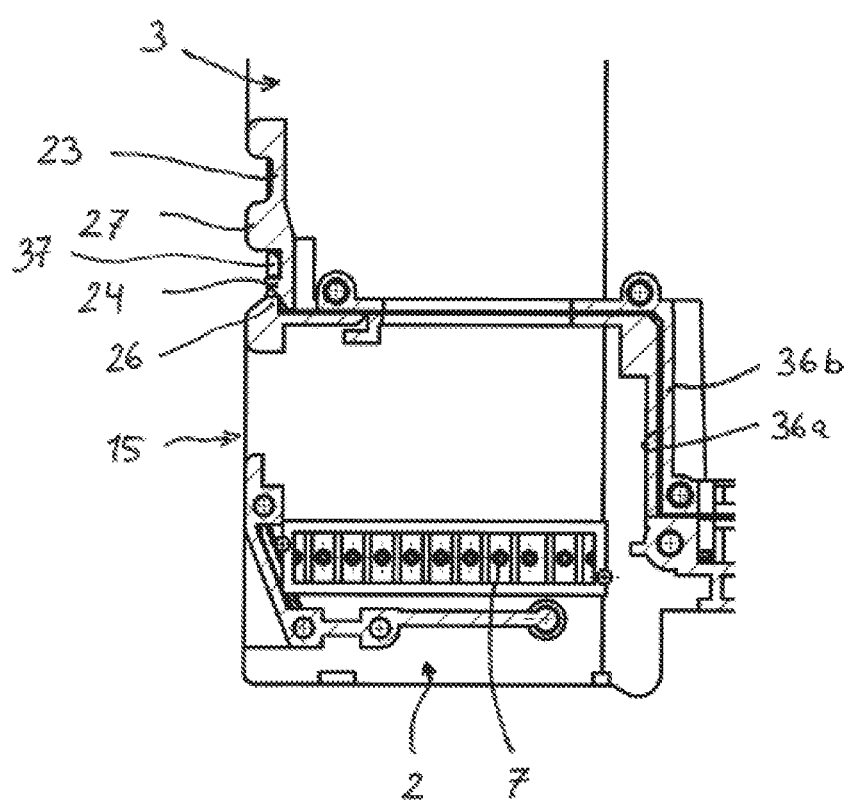
FIG. 6—illustrates a detailed view of the section C of the electronic device in FIG. 5.

FIG. 6 illustrates a detailed view of the section C of the electronic device 1 indicated in FIG. 5 along the section line B-B. It is further clear that the elastically resilient latching arm 23 is arranged with its free end facing in the direction towards the base module 2 if the electronic module 3 is attached to the base module 2 in the proper manner in the illustrated operating state. It is also clear that the wedge-shaped tapering latching lug protrudes with its elevated area out of the center of the electronic module 3 so as to form an interacting stop at that site with the connecting piece 37 of the latching protrusion 26 of the base module 2.

The invention claimed is:

1. An electronic device comprising:
 a base module and an electronic module that can be plugged onto the base module in a detachable manner,
 wherein the base module comprises an insulating-material housing having a latching base for latching the base module onto a carrier rail and plug contacts on side walls of the insulating-material housing,
 wherein the electronic module comprises an insulating-material housing and when plugged onto the base module can be connected to the allocated plug contacts of the base module,
 wherein the base module and the electronic module have interacting latching elements for latching the base module and the electronic module to one another when the electronic module is plugged onto the base module, and
 wherein a latching element of the electronic module has an actuating lug on a second end face of the electronic device and the electronic module has a catch lug on a first end face of the electronic device that lies opposite the second end face of the electronic device, and the electronic module and the base module have mutually interacting linear guides, wherein the electronic module can be held on the base module by the linear guides in a linear displaceable manner.

2. The electronic device as claimed in claim 1, characterized in that an elastically resilient latching arm is formed as one in an integral manner with the insulating-material housing of the electronic module, that the latching arm has the actuating lug and at a free end of the latching arm supports a latching lug and, in the plugged-on state latched onto the base module, faces with the free end towards the base module, and that a latching protrusion that protrudes in the direction towards the electronic module is provided on the insulating-material housing of the base module, said latching protrusion having a latching opening that is delimited by means of a connecting piece on a free end of the latching protrusion.

3. The electronic device as claimed in claim 2, characterized in that at one of the end faces of the electronic device latching elements having the elastically resilient latching arm and the allocated latching opening are provided and at the opposite lying end face the electronic module is indirectly locked on the base module.

4. The electronic device as claimed in claim 3, characterized in that the electronic device has a conductor connecting module that can be plugged onto the electronic module and comprises conductor connecting terminals for connecting electrical lines, wherein the conductor connecting terminals are connected to the electronic module in an electrically conductive manner, in the operating state in which the conductor connecting module is plugged onto the electronic module, and wherein the conductor connecting module and the base module have on the first end face locking elements for fixing the conductor connecting module to the base module, said end face lying opposite the elastically resilient latching arm and the allocated latching opening.

5. The electronic device as claimed in claim 1, characterized in that the catch lug protrudes into an opening in the insulated material housing of the base module and preferably protrudes out of the first end face of the base module.

6. The electronic device as claimed in claim 5, characterized in that the opening is open in the direction that faces away from the base module.

7. The electronic device as claimed in claim 1, characterized in that the catch lug is arranged adjacent to a conductor connecting module that in the operating state is plugged onto the electronic module.

8. The electronic device as claimed in claim 2, characterized in that the resilient latching arm lies closer to the actuating lug on the plane that extends through a lower face of the base module having the latching base than to the catch lug that lies opposite the actuating lug.

9. The electronic device as claimed in claim 1, characterized in that the catch lug has flutings.

10. The electronic device as claimed in claim 2, characterized in that the catch lug has flutings and/or the actuating lug has flutings on the elastically resilient latching arm.

11. The electronic device as claimed in claim 9, characterized in that the flutings of the catch lug include connecting pieces that extend in a transverse manner with respect to the plugging-in direction and are spaced apart from one another.

12. The electronic device as claimed in claim 10, characterized in that the flutings of the catch lug and/or the flutings of the actuating lug include connecting pieces that extend in a transverse manner with respect to the plugging-in direction and are spaced apart from one another.

* * * * *